United States Patent
Roberson, Jr. et al.

(10) Patent No.: US 6,368,411 B2
(45) Date of Patent: *Apr. 9, 2002

(54) MOLECULAR CONTAMINATION CONTROL SYSTEM

(75) Inventors: Glenn A. Roberson, Jr., Hollister, CA (US); Robert M. Genco, Atlanta, GA (US); Robert B. Eglinton, Carmel; Wayland Comer, Salinas, both of CA (US); Gregory K. Mundt, Duluth, GA (US)

(73) Assignee: Semifab Incorporated, Hollister, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/790,769

(22) Filed: Feb. 21, 2001

Related U.S. Application Data

(63) Continuation of application No. 09/460,616, filed on Dec. 14, 1999, now Pat. No. 6,221,163, which is a continuation of application No. 09/240,254, filed on Jan. 29, 1999, now Pat. No. 6,042,651, which is a continuation of application No. 08/713,396, filed on Sep. 13, 1996, now Pat. No. 5,879,458.

(51) Int. Cl.[7] .............................. B65B 1/04; B65D 85/30; C23C 16/00
(52) U.S. Cl. ..................... 118/715; 206/710; 206/711; 206/454; 414/217; 414/291; 414/935; 141/98; 141/85; 141/383
(58) Field of Search ..................... 206/711, 710, 206/712, 454; 220/323, 89.1; 141/91, 92, 98, 319, 320, 321, 322, 323, 346, 383–386, 392, 4–8; 414/217, 221, 287, 288, 291, 935, 937, 939, 940; 118/715, 724, 500

(56) References Cited

U.S. PATENT DOCUMENTS

| | | | |
|---|---|---|---|
| 4,616,683 A | 10/1986 | Tullis et al. | 141/98 |
| 4,705,444 A | 11/1987 | Tullis et al. | 414/226 |
| 4,724,874 A | 2/1988 | Parikh et al. | 141/98 |
| 4,728,389 A | 3/1988 | Logar | 156/612 |

(List continued on next page.)

FOREIGN PATENT DOCUMENTS

| | | |
|---|---|---|
| DE | 4326308 C | 10/1994 |
| WO | WO 98/11598 | * 8/1997 |

OTHER PUBLICATIONS

International Search Report Re PCT/US97/14969.

Primary Examiner—Jeffrie R. Lund
(74) Attorney, Agent, or Firm—Fliesler Dubb Meyer & Lovejoy LLP

(57) ABSTRACT

The system and method for molecular contamination control permits purging a SMIF pod to desired levels of relative humidity, oxygen, or particulates. The SMIF pod includes an inlet port including a check valve and filter assembly for supplying a clean, dry gaseous working fluid to maintain low levels of moisture, oxygen, and particulate content around materials contained in the SMIF pod. The SMIF pod outlet port, which also includes a check valve and filter assembly, is connected with an evacuation system. Flow of purge gas inside the SMIF pod can be directed with one or more nozzle towers to encourage laminar flow inside the pod, and one or more outlet towers., having a function similar to that of the inlet tower, may also be provided. The purge gas can be dried by exposure to a desiccant, heated to temperatures between about 100° C. and about 120° C., and can be tested for baseline constituent levels prior to or after introduction into a SMIF pod. Multiple SMIF pods can also be purged by a single contamination control base unit.

3 Claims, 9 Drawing Sheets

U.S. PATENT DOCUMENTS

| | | | |
|---|---|---|---|
| 4,745,088 A | 5/1988 | Inoue et al. | 437/102 |
| 4,804,086 A | 2/1989 | Grohrock | 206/328 |
| 4,863,561 A | 9/1989 | Freeman et al. | 156/646 |
| 4,957,781 A | 9/1990 | Kanegae et al. | 427/255.3 |
| 5,032,545 A | 7/1991 | Doan et al. | 437/242 |
| 5,169,272 A | 12/1992 | Bonora et al. | 414/217 |
| 5,252,133 A | 10/1993 | Miyazaki et al. | 118/725 |
| 5,255,783 A | 10/1993 | Goodman et al. | 206/334 |
| 5,277,579 A | 1/1994 | Takanabe | 432/5 |
| 5,320,218 A | 6/1994 | Yamashita et al. | 206/213.1 |
| 5,354,198 A | 10/1994 | Yates | 432/5 |
| 5,373,806 A | 12/1994 | Logar | 117/106 |
| 5,433,574 A | 7/1995 | Kawano et al. | 414/217 |
| 5,469,963 A | 11/1995 | Bonora et al. | 206/709 |
| 5,482,161 A | 1/1996 | Williams et al. | 206/711 |
| 5,536,320 A | 7/1996 | Ushikawa et al. | 118/719 |
| 5,575,081 A | 11/1996 | Ludwig | 34/218 |
| 5,611,452 A | 3/1997 | Bonora et al. | 220/378 |
| 5,735,961 A | 4/1998 | Shimada | 118/724 |
| 5,740,845 A | 4/1998 | Bonora et al. | 141/292 |
| 5,810,062 A * | 9/1998 | Bonora et al. | 141/351 |
| 5,879,458 A * | 3/1999 | Roberson et al. | 118/715 |
| 6,042,651 A * | 3/2000 | Roberson et al. | 118/715 |
| 6,221,163 B1 * | 4/2001 | Roberson et al. | 118/715 |

* cited by examiner

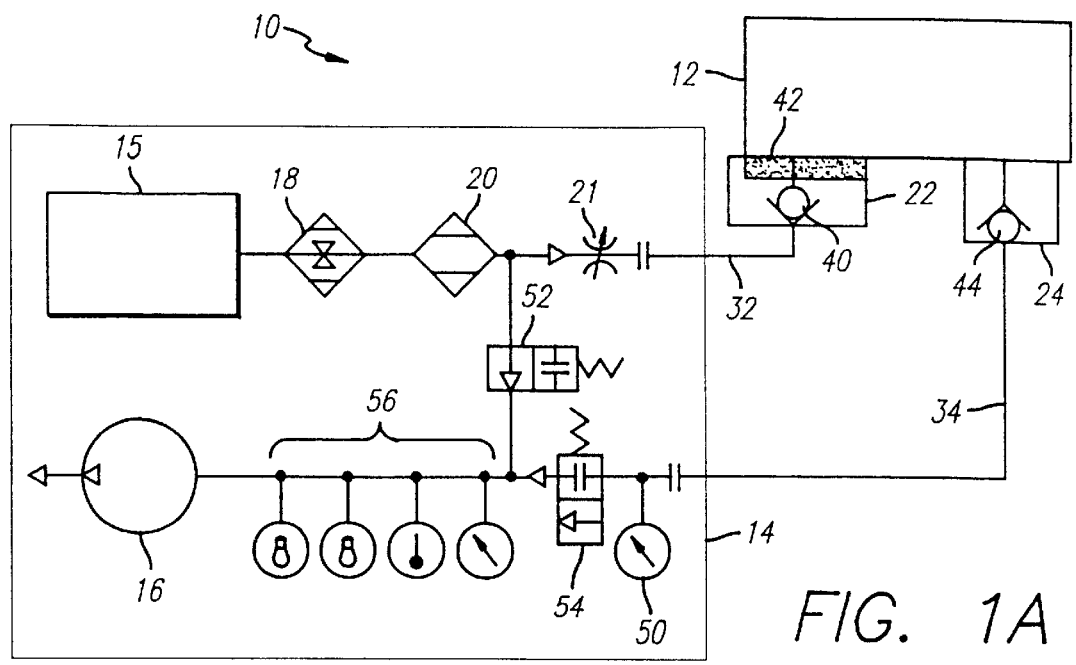
FIG. 1A
FIG. 1B
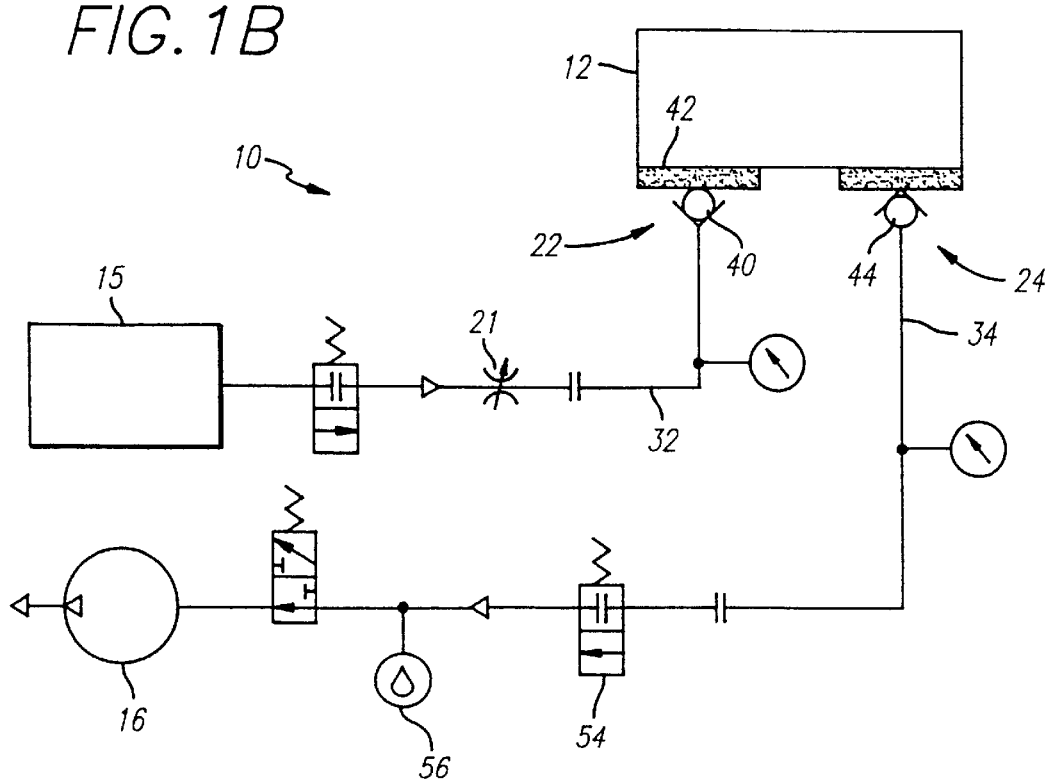

FIG. 5
FIG. 6
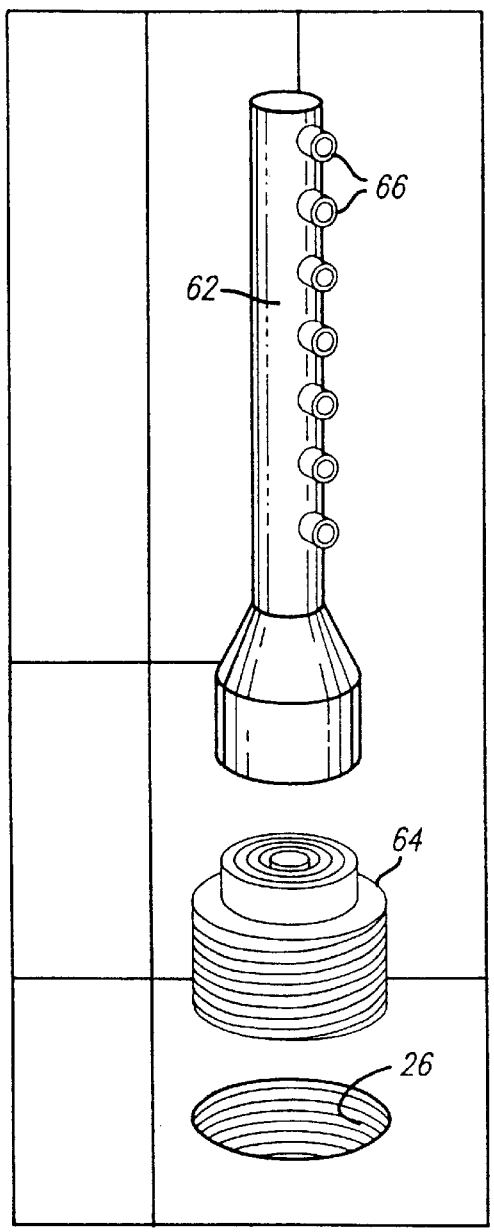
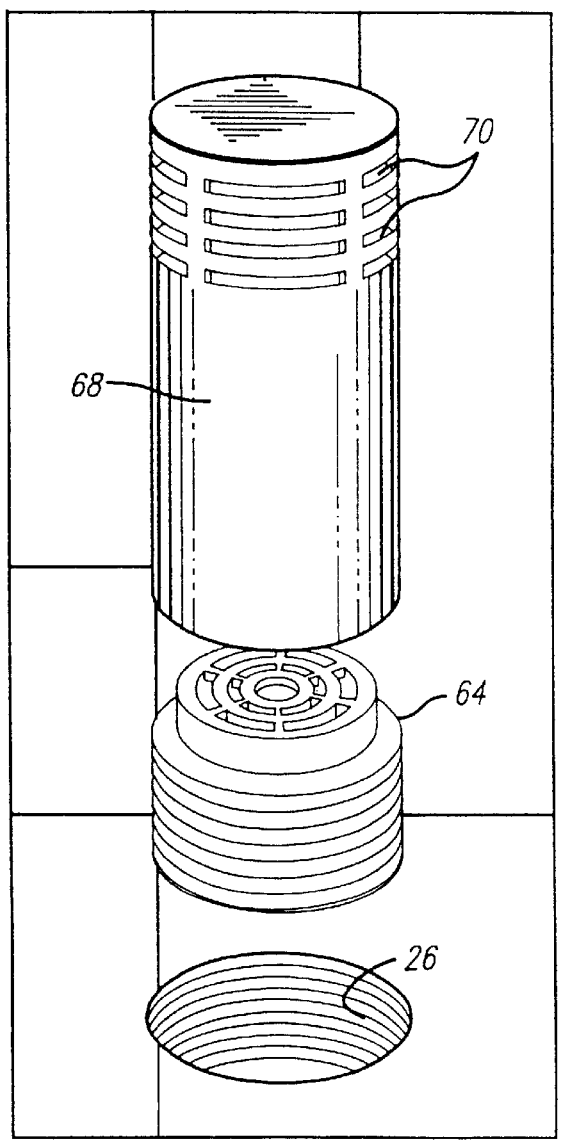

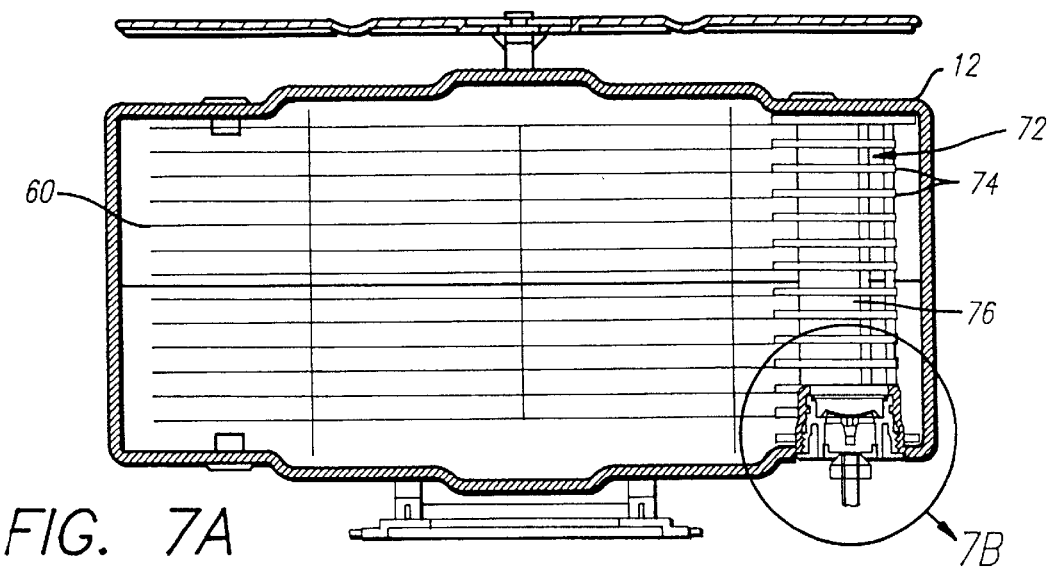
FIG. 7A
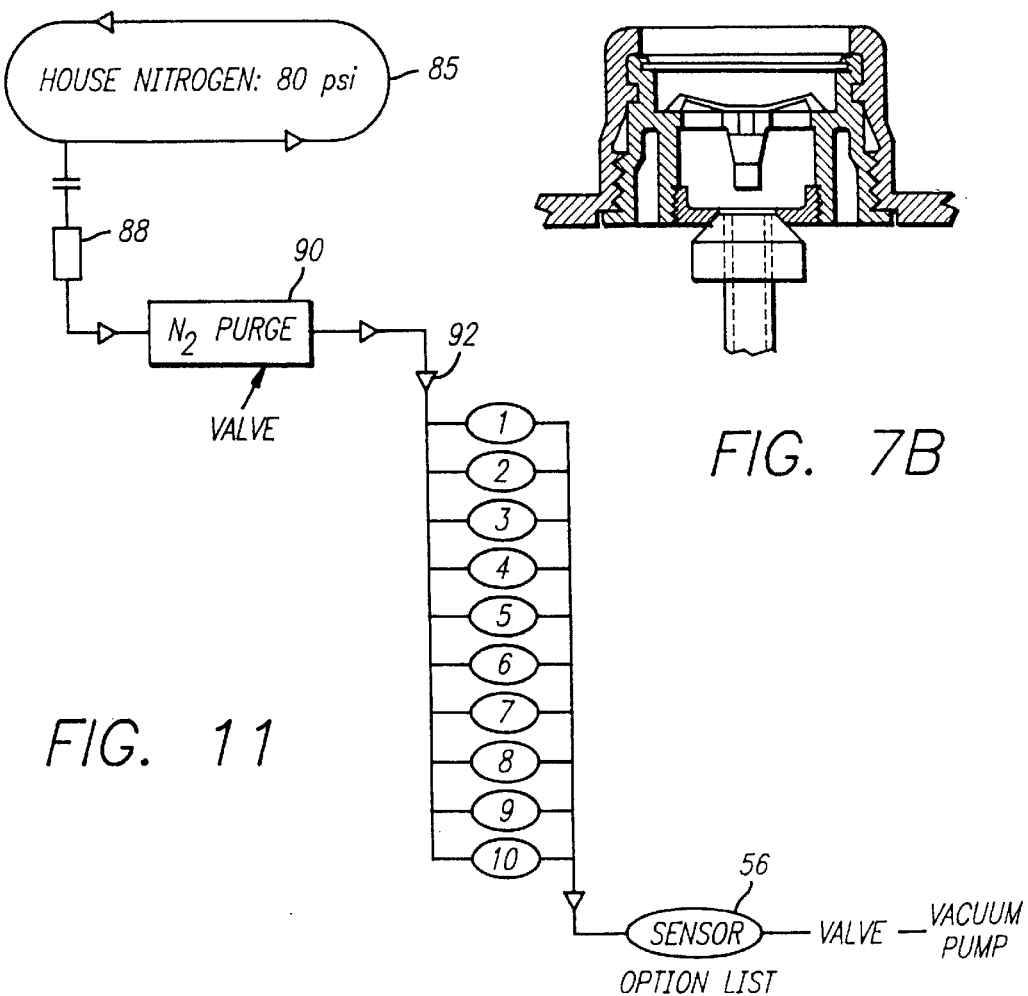
FIG. 7B
FIG. 11

FIG. 8A
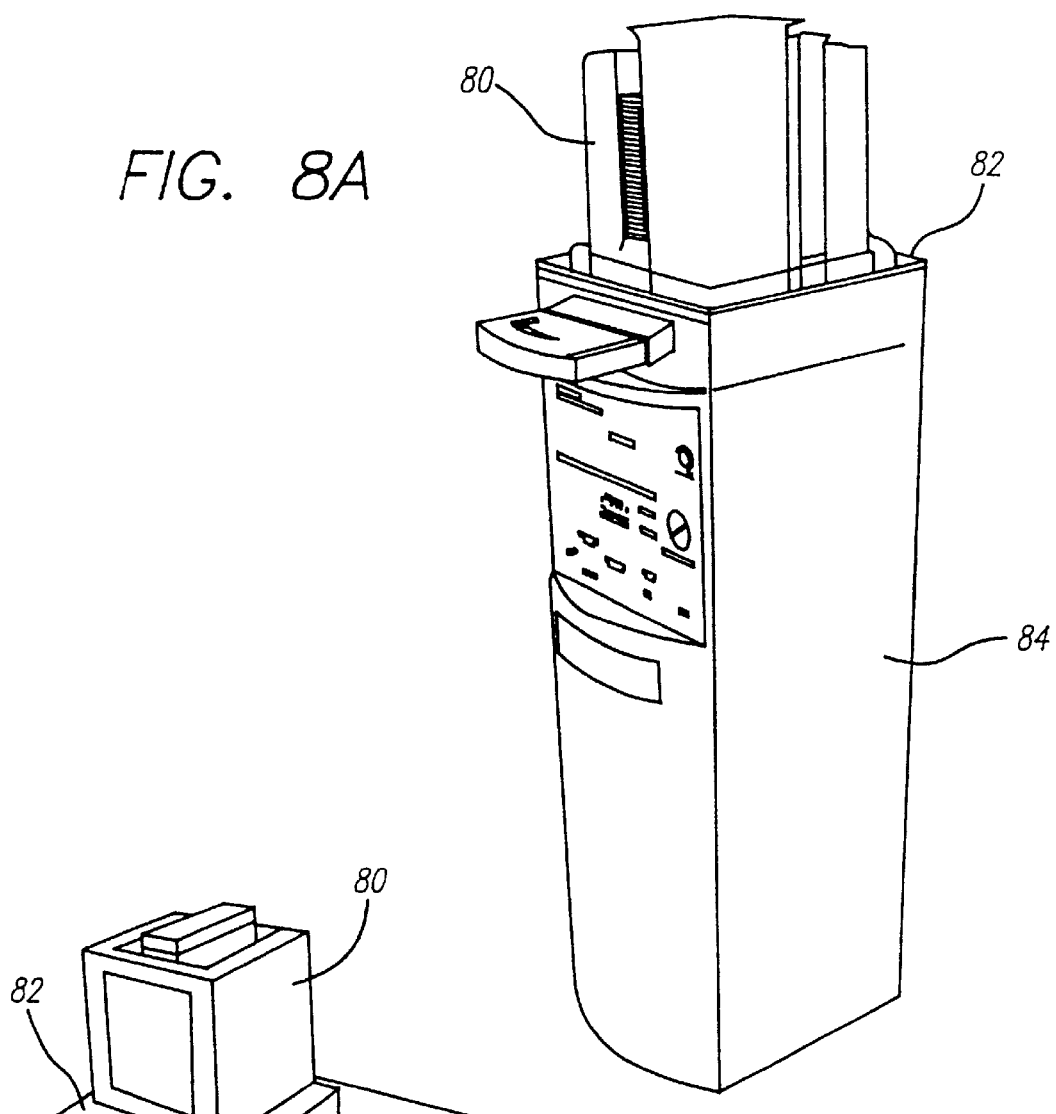
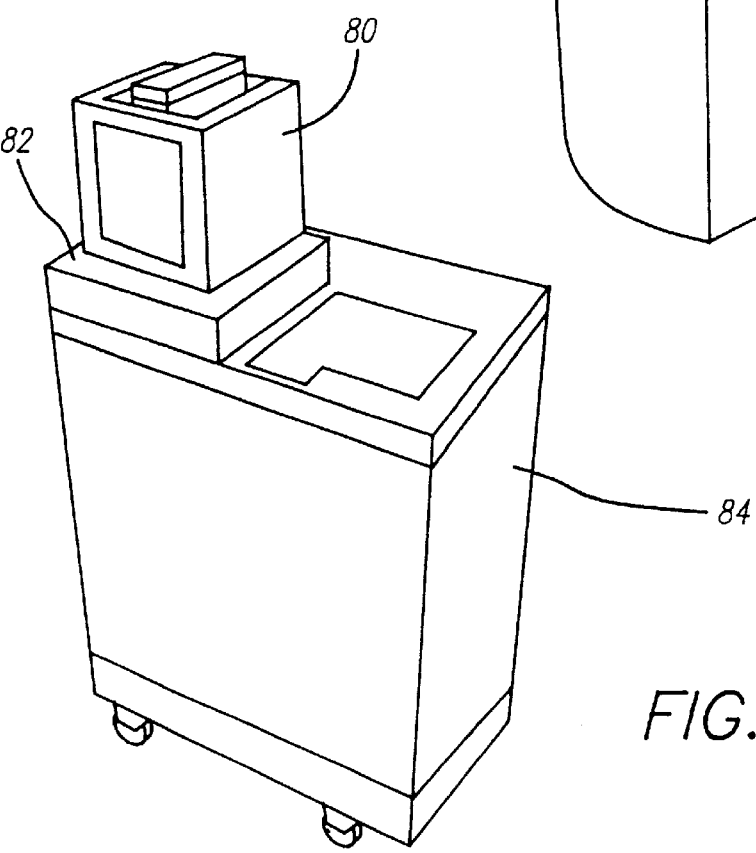
FIG. 8B

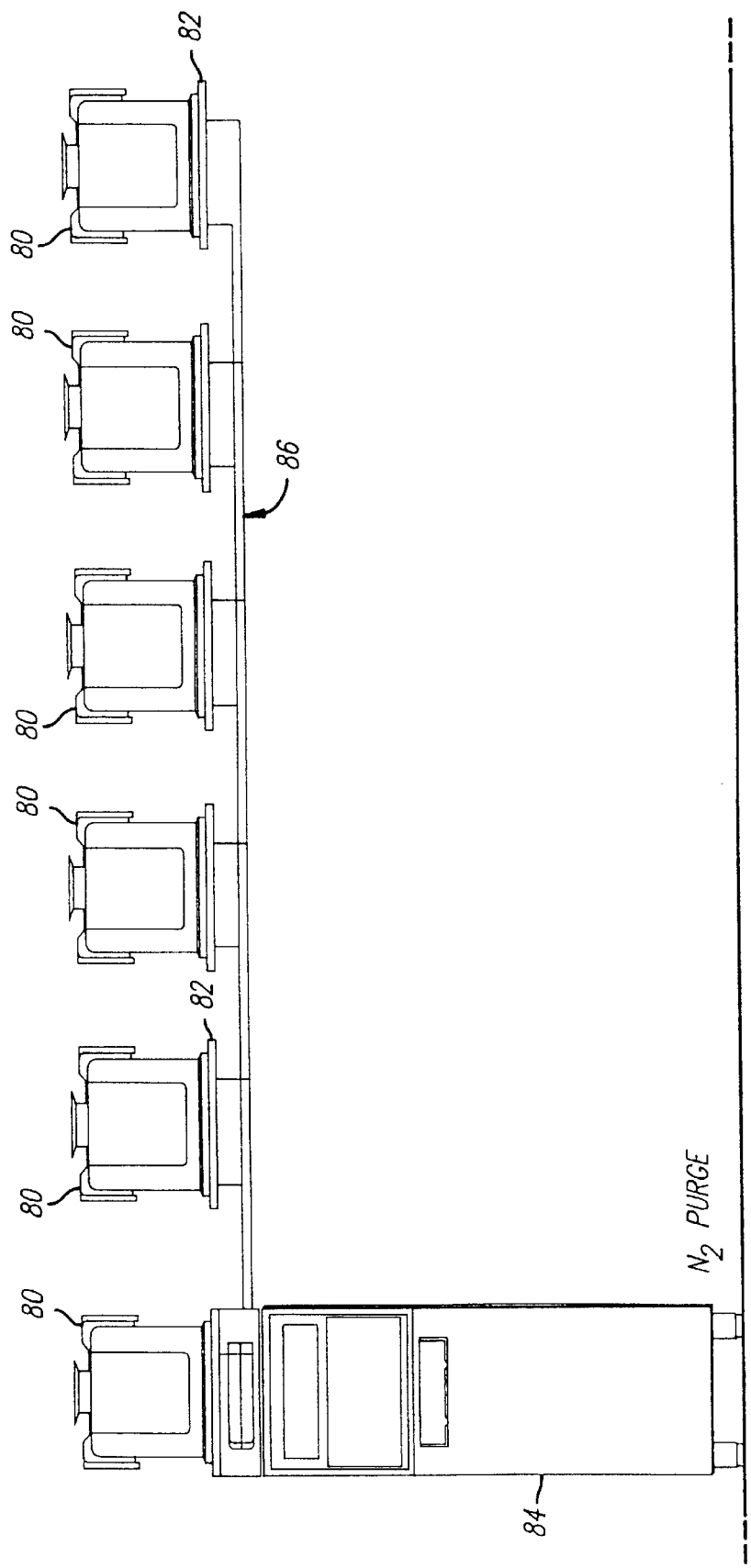

MOLECULAR CONTAMINATION CONTROL SYSTEM

RELATED APPLICATIONS

This is a Continuation of Ser. No. 09/460,616, filed Dec. 14, 1999, now U.S. Pat. No. 6,221,163, which is a Continuation of Ser. No. 09/240,254 filed Jan. 29, 1999, now U.S. Pat. No. 6,042,651, which is a Continuation of Ser. No. 08/713,396 filed Sep. 13, 1996 now U.S. Pat. No. 5,879,458.

BACKGROUND OF THE INVENTION

1. Field of the Invention

This invention relates generally to systems and methods for semiconductor fabrication, and more particularly concerns systems and methods for purging a modular isolation chamber such as a standard mechanical interface box or pod used for storing or transporting semiconductor manufacturing materials, to desired levels of relative humidity, oxygen, or particulates.

2. Description of Related Art

A modular isolation chamber such as a standard mechanical interface (SMIF) box, or pod, typically provides a microenvironment to isolate and control the environment surrounding a wafer, cassette of wafers or substrates used in manufacturing integrated circuits, during storage, transport and processing of the materials. Processing of such materials traditionally has been carried out in a particulate free environment generally known as a "clean room". However, maintenance of such "clean rooms" in a contaminant free state can require a great deal of care and effort, particularly during processing of the materials.

In one conventional system in which a SMIF system is used to replace a traditional clean room, filtered air is circulated in the SMIF box, and still air is used to achieve cleanliness in the SMIF box. A particle-free dockable interface for linking together two spaces each enclosing a clean air environment includes interlocking doors on each space that fit together to trap particles which have accumulated from the dirty ambient environment on the outer surfaces of the doors. A processing apparatus and technique is also known for thermal processing in the manufacture of semiconductor devices, to prevent outside air from entering a reaction tube. Loading and unloading an object to be processed is typically effected by an insertion jig outside a heating section, to prevent outside air from entering the heated processing chamber.

While such systems can control the level of particulates in a SMIF box, the presence of oxygen can also degrade the surface of semiconductor materials. In one conventional process for preventing the formation of native oxides on the surface of semiconductor materials, silicon nitride layers are formed on silicon substrates. Purge systems are also known, such as one in which a movable cantilevered purge system provides for a wafer load position, a wafer purge position, and a wafer process position. A purge injector and return exhaust tube are provided in an elephant tube which provides for access to wafer loads. In another known system, the manufacturing materials are subjected to cold-nitrogen purge cycles, and particles and particle-generated defects during gas phase processing such as during deposition are decreased by controlling particle transport mechanisms, such as by applying low level radiant energy during cold nitrogen purge cycles.

The presence of humidity in a SMIF box can also be undesirable. One conventional method and apparatus for cleaning integrated circuit wafers utilizes dry gases. At least one of the gases is excited by passing the gas through a microwave plasma generator or by heating the wafer, exciting the gases near the surface of the wafer, causing chemical reactions similar to those induced by ionization of nongaseous cleaning materials in water. After an etching period, the etching chamber is purged by inert gas, such as nitrogen, which helps carry away the remaining reacted contaminants, which can include vaporous halogens or radicals that can be present after conventional processes, such as chlorine, bromine, arsine, silane, and the like.

However, there remains a need for a system and method of purging SMIF pods to consistently maintain desired levels of relative humidity, oxygen, or particulates while the pods are otherwise not required, such as while waiting for a next production station or step in a fabrication facility. These periods have been estimated to be about six minutes to several hours long. Ideally, the SMIF pod should be completely purged to desired levels of relative humidity, oxygen, or particulates in a period of about 6 minutes or less. The present invention meets these needs.

SUMMARY OF THE INVENTION

Briefly, and in general terms, the present invention provides for an improved system and method for purging a SMIF pod to desired levels of relative humidity, oxygen, or particulates. In one preferred embodiment, the SMIF pod includes an inlet port and an outlet port, each including a check valve filter assembly, for a clean, dry gaseous working fluid that is used to provide controlled low levels of moisture, oxygen, and particulate content around the materials contained in the SMIF pod. The SMIF pod inlet port is connected with a gaseous working fluid source, and the outlet port is connected with an evacuation system. The integral directional flow check valves operate at very low pressure differentials (such as less than 10 millibar).

The method of the invention also provides for improvements to a purge process by drying of purge gas by exposure to a desiccant; heating the purge gas to temperatures above 100° C., but below the thermal sensitivity of the pod, i.e., 105 to 120° C.; and testing the pre-treated gaseous working fluid for baseline constituent levels prior to introduction into a SMIF Pod. In another aspect of the invention, an improved inlet flow of the purge gas is provided, by maintaining the purge gas velocity throughout the gas stream in the pod at a laminar flow velocity, below sonic flow velocity, to prevent formation of undesirable vortices that may trap moisture or particles, and to encourage laminar flow inside the pod. In another embodiment, flow of purge gas inside the SMIF pod is directed towards the product using one or more nozzle towers to encourage laminar flow inside the pod. One or more outlet towers, having a function similar to that of the inlet tower, may also be provided to encourage laminar flow inside the pod. In another embodiment, integrated towers are provided to direct and disperse flow of the gaseous working fluid throughout the pod envelope. A molecular contamination control base unit on which the SMIF pod can be mounted can also include features for improvement of the purging of the environment in the pod. In another aspect of the method of the invention, mass flow control can be used to ramp the gas flow rate up and down in a controlled manner to avoid generation of particles due to "rattling" of the wafers in the SMIF pod.

These and other aspects and advantages of the invention will become apparent from the following detailed description, and the accompanying drawings, which illustrate by way of example the features of the invention.

BRIEF DESCRIPTION OF THE DRAWINGS

FIG. 1A is a schematic diagram of a single SMIF pod mounted to a molecular contamination control base unit for purging of the SMIF pod according to the invention;

FIG. 1B is a schematic diagram of an alternative embodiment of a single SMIF pod mounted to a molecular contamination control base unit for purging of the SMIF pod according to the invention;

FIG. 5 is an exploded perspective view of an inlet tower of the SMIF pod of FIG. 4;

FIG. 6 is an exploded perspective view of an alternate embodiment of an inlet tower for the SMIF pod of FIG. 4;

FIG. 7A is an alternate embodiment of a SMIF pod having inlet towers integrated into wafer support arms of a SMIF pod, showing a circled portion in section;

FIG. 7B is an enlargement of the sectional view of the circled portion of FIG. 7A;

FIG. 8A is a perspective view of a single SMIF pod mounted to a molecular contamination control base unit for purging of the SMIF pod according to the invention;

FIG. 8B is a perspective view of an alternative embodiment of a single SMIF pod mounted to a molecular contamination control base unit for purging of the SMIF pod according to the invention;

FIG. 9A is a front elevational view of a series of several SMIF pods mounted to base plates connected in parallel to gaseous working fluid supply and exhaust lines of a molecular contamination control base unit for purging of the SMIF pods according to the invention;

FIG. 11 is a schematic diagram of the mounting of multiple SMIF pods to a molecular contamination control base unit for purging of the SMIF pods according to the invention.

DETAILED DESCRIPTION OF THE PREFERRED EMBODIMENTS

Figure 2:
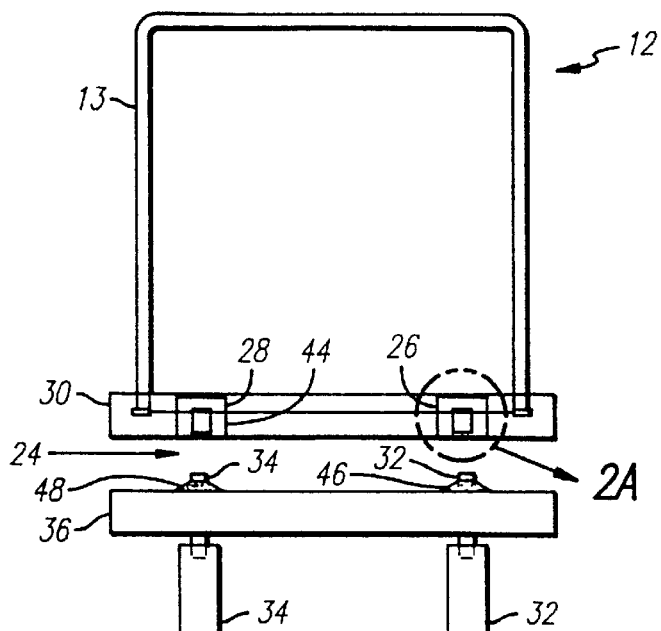
FIG. 2 is a partial sectional view illustrating the mounting of a SMIF pod to a base plate of a molecular contamination control base unit of FIGS. 1A and 1B.
Figure 2A:
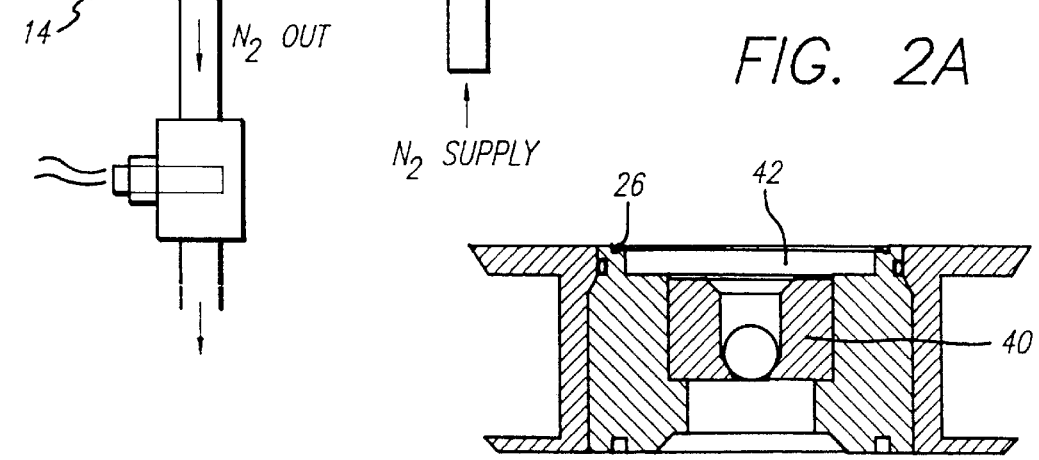
FIG. 2A is an enlargement of the sectional view of the circled portion of FIG. 2.

Since particulates, humidity and oxygen can contaminate and degrade the surface of semiconductor manufacturing materials, it is important to adequately purge and maintain the local manufacturing environment for such materials free of such contaminants. Contaminants in the atmosphere can include water vapor, oxygen, and particulates, and contaminants produced during conventional manufacturing processes can include vaporous halogens or radicals, such as chlorine, bromine, arsine, and silane, for example. As is illustrated in the drawings, the invention provides for improvements in a system and methods for purging a SMIF pod to desired levels of relative humidity, oxygen, or particulates.

With reference to FIGS. 1A, 1B, 2 and 2A, in a preferred embodiment of the molecular contamination control system 10 of the invention, a standard mechanical interface (SMIF) box, or pod 12 having a housing 13 forming a chamber, is adapted to be mounted for operation in combination with a molecular contamination control base unit 14 providing a source 15 of gaseous working fluid, such as nitrogen gas, argon gas, or other similar inert gas or combination of gases, at a pressure of about 80 psi, for example, in fluid communication with the SMIF pod for purging the SMIF pod. Pressurized nitrogen gas and other inert gases are typically available at pressures from about 65 to about 125 psi. Currently, nitrogen gas is preferred, and the pressure of the working gas within the system is controlled using a point-of-use regulator, limiting feed-pressure to the inlet of the SMIF pod to a maximum of about 10 psi, while working pressures within the SMIF pod are typically about 1 psi. A vacuum pump 16 is also preferably provided in fluid communication with the SMIF pod for removing the gaseous working fluid, particulate and other contaminants, oxygen, and humidity from the SMIF pod.

As is shown in FIG. 1A, the gaseous working fluid being supplied to the SMIF pod can also be heated by a heater 18, and can be dried by a desiccator 20. The gaseous working fluid, or purge gas, can be dried, for example, by exposure of gas flowing from a nitrogen or other inert gas source to the SMIF pod to a desiccant in the desiccator that will chemically react with any residual moisture in the purge gas, and that will introduce no undesirable constituents to the purge gas. In a presently preferred embodiment, the purge gas can also be heated to temperatures above 100° C., but below the thermal sensitivity of the pod, such as, for example, between 105° to 120° C. As is illustrated in FIGS. 1A and 1B, mass flow control valve 21 is also preferably provided in fluid communication between the source of gaseous working fluid and one or more inlets of the SMIF pod for controlling the supply flow of gaseous working fluid to the SMIF pod. Mass flow control is preferably used to ramp the gas flow rate up and down in a controlled manner to avoid generation of particles caused by "rattling" of the wafers in the SMIF pod. Purge gas velocity throughout the gas stream in the pod is also preferably maintained at a laminar flow velocity, below sonic flow velocity, to prevent formation of undesirable vortices that may trap moisture or particles, and to encourage laminar flow inside the pod.

With reference to FIGS. 1A to 3B, in a presently preferred embodiment of the invention, check valve assemblies 22 and 24 are incorporated into each of the one or more inlet ports 26 and the one or more outlet ports 28 located in the base 30 of the SMIF pod. The inlet port of the SMIF pod base is adapted to be connected in fluid communication with a supply or feed line 32, and the outlet port of the SMIF pod base is adapted to be connected in fluid communication with an exhaust or outlet line 34, respectively, of a base plate 36 of a molecular contamination control base unit 14, to which the SMIF pod can be mounted. The SMIF pod base 30 serves as a door to the SMIF pod, and is sometimes referred to as the SMIF pod door.

Figure 3A:
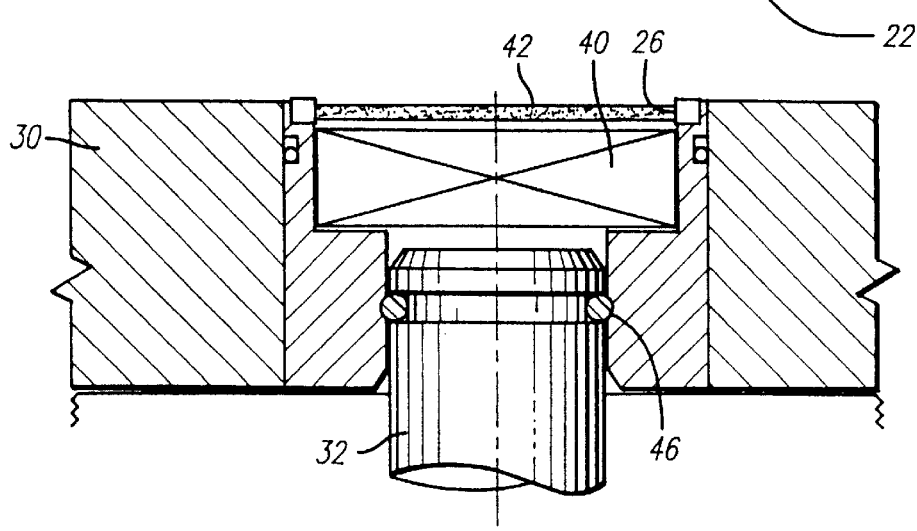
FIG. 3A is an enlarged sectional view of a mechanical interface of a check valve port with a fluid line of the base plate of a molecular contamination control base unit of FIGS. 1A and 1B.
Figure 3B:
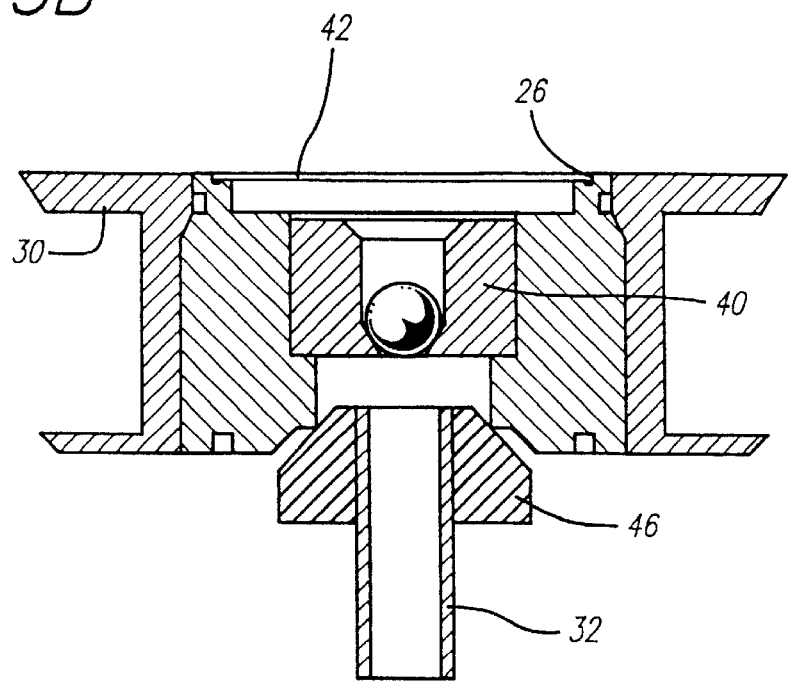
FIG. 3B is an enlarged sectional view of an alternative embodiment of a mechanical interface of a check valve port with a fluid line of the base plate of a molecular contamination control base unit of FIGS. 1A and 1B.

As is illustrated in FIGS. 3A and 3B, the check valve assembly of the inlet port includes a check valve 40 allowing one-way flow of the gaseous working fluid into the SMIF pod, and a filter 42 to remove particulate matter. The check valve assembly of the outlet port typically only need include a check valve 44 allowing one-way flow of the gaseous working fluid out of the SMIF pod, but can also include a filter as in the inlet port check valve and filter assembly. The integral directional flow check valves are preferably activated at very low pressure differentials, typically less than 10 millibar. The feed line 32 and exhaust line 34 typically extend from the base plate of the molecular contamination control base unit and include o-ring seals 46, 48, that are sized to sealingly mate the supply line and exhaust line in the inlet and outlet ports, respectively.

The check valve assemblies of the inlet and outlet ports help to insure that only a clean, dry gaseous working fluid enters the SMIF pod, to provide a controlled environment around the contents of the SMIF pod with an ultra low moisture content, a very low oxygen content, and a very low particulate content. With a gaseous working fluid of substantially 100% nitrogen or other inert gas to purge the SMIF pod, the atmospheric content of the SMIF pod typically can reach a relative humidity level of about 0.1%, and substantially no oxygen, in approximately five minutes, for example. Ideally, a SMIF Pod can be completely purged to desired levels of relative humidity, oxygen, or particulates in a period of about 6 minutes or less.

As is shown in FIG. 1A, in one embodiment, the gaseous working fluid exhaust line in the molecular contamination control base unit can also include a flow meter 50 for monitoring the flow of gaseous working fluid through the SMIF pod and a pair of valves 52, 54, for diverting flow of the working gas from the SMIF pod directly from the supply line to the exhaust line, for monitoring by sensors 56 for humidity, oxygen, and particulates, as well as temperature, for example. In one presently preferred embodiment, the valves can comprise an electronically controlled solenoid valve 52 controlling flow of gaseous working fluid from the supply to the exhaust line, and an electronically controlled solenoid valve 54 controlling flow of gaseous working fluid from the SMIF pod through the exhaust line. By closing the connecting valve 52 and opening exhaust line valve 54, contaminant levels in gaseous working fluid exiting from the SMIF pod can be monitored by sensors 56; by opening the connecting valve 52 and closing exhaust line valve 54, for testing the pre-treated gaseous working fluid by sensors 56 for baseline constituent levels prior to introduction of the gaseous working fluid into a SMIF pod. In an alternative preferred embodiment illustrated in FIG. 1B, since the purity of the working gas can typically be controlled at the source, such as by certification from a vendor of the working gas, or by testing prior to use at the facility or laboratory, for example, monitoring of the condition of the working gas is not required, and monitoring of the gas exiting the SMIF pod by a sensor at 56, such as a hygrometer, for example, included in the exhaust line, can be provided for optionally monitoring contaminant levels in gaseous working fluid exiting from the SMIF pod.

Figure 4:
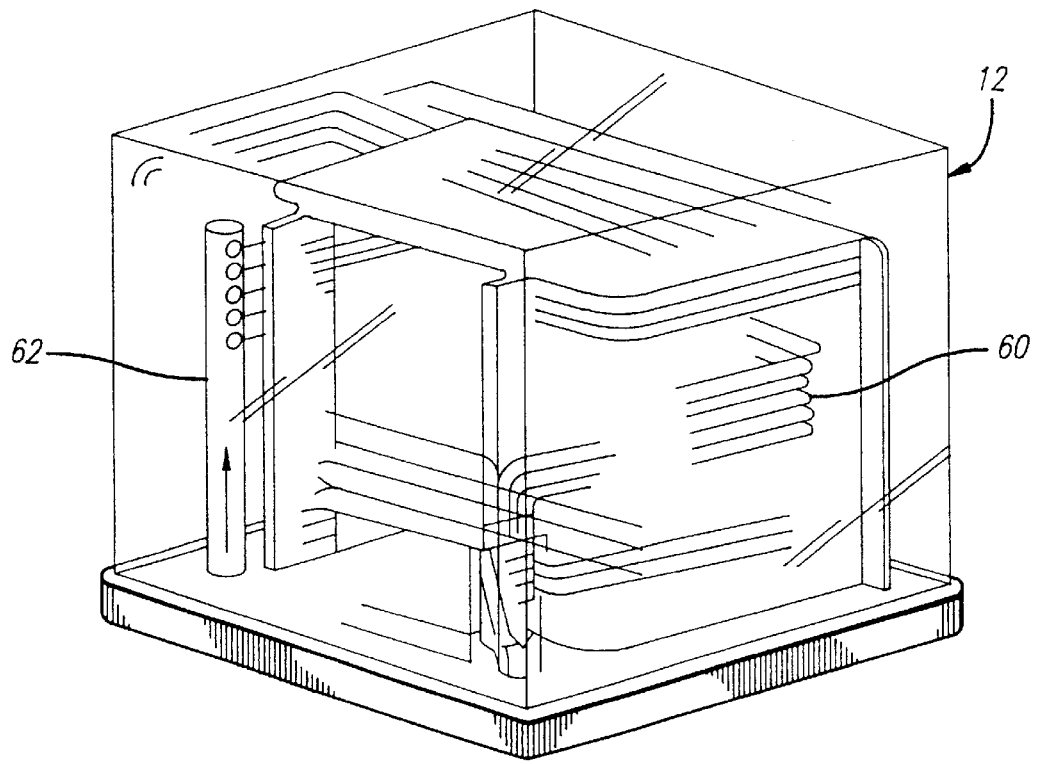
FIG. 4 is a perspective view of an improved SMIF pod according to the invention.

Referring to FIGS. 4 and 5, in a presently preferred embodiment of the invention, flow of the gaseous working fluid or purge gas inside a SMIF pod can be directed toward and away from wafer or substrate manufacturing materials 60 housed in the SMIF pod using one or more uniquely configured towers 62 connected by a mounting member 64 to the inlet port 26 or to the outlet port 28. Orifices are provided in each tower, preferably in the form of a series of spaced apart nozzles 66 that are graduated in size. When used as an inlet tower, the effect of the graduation of size of the nozzles is to generate a uniform velocity field near the inlet tower, thereby vectoring the gas currents around the inside of the SMIF pod. The gaseous working fluid will sweep the SMIF pod and its contents, picking up residual moisture and encouraging movement of particulates toward the exhaust port. In one preferred alternate embodiment, illustrated in FIG. 6, the tower configuration can be in the form of a tower 68 with a series of spaced apart, radial slotted ports 70. One or more vent towers are also preferably connected to the outlet port or ports, having a structure and function similar to that of the inlet towers, to direct flow to the outlet valve for exhausting to the instrument suite, and to the local environment. The outlet towers thus preferably have the configuration as illustrated in FIG. 5, or in an alternate embodiment, as illustrated in FIG. 6. When used as an outlet tower, the nozzle openings encourage increased gaseous working fluid velocities from the slower gaseous working fluid velocities in the pod, to more rapid flow velocities in the exhaust line.

In another preferred alternative embodiment shown in FIGS. 7A and 7B, inlet towers 72 can be integrated into wafer support arms 74 of the SMIF pod, in the tubular vertical element 76, to direct and disperse flow of the gaseous working fluid throughout the pod envelope. On an opposing side of the SMIF pod, one or more similar outlet or exhaust towers (not shown) can be provided to draw off purge gas laden with residues for discharge. The integrated inlet and outlet towers do not compromise the operation of the base plate "door" of the SMIF pod, and do not impose constraints on supporting robotic apparatus used in wafer processing.

The system and method of the invention are planned for use while the SMIF pods are otherwise not required, i.e., while waiting for the next production station or step in the fabrication facility. These periods have been estimated to be about six minutes to more than one hour long. Ideally, the SMIF pod is completely purged to desired levels of relative humidity, oxygen, or particulates in a period of about 6 minutes or less. Relative humidity levels of about 0.1% or less have been achieved in about 5 minutes. Flow of the gaseous working fluid or purge gas is typically provided in the SMIF pod at up to 20 SCFH, and at a pressure of from about zero to about 5 psi. Pressurized nitrogen gas and other inert gases are typically available at pressures from about 65 to about 125 psi, and the pressure of the working gas within the system is typically controlled using a point-of-use regulator, limiting feed pressure to the inlet of the SMIF pod to a maximum of about 10 psi. Working pressures within the SMIF pod are typically about 1 psi. The gaseous working fluid or purge gas is filtered to remove particulates as small as 0.10–2.0 microns at an efficiency of about 99.999%.

Figure 9B:
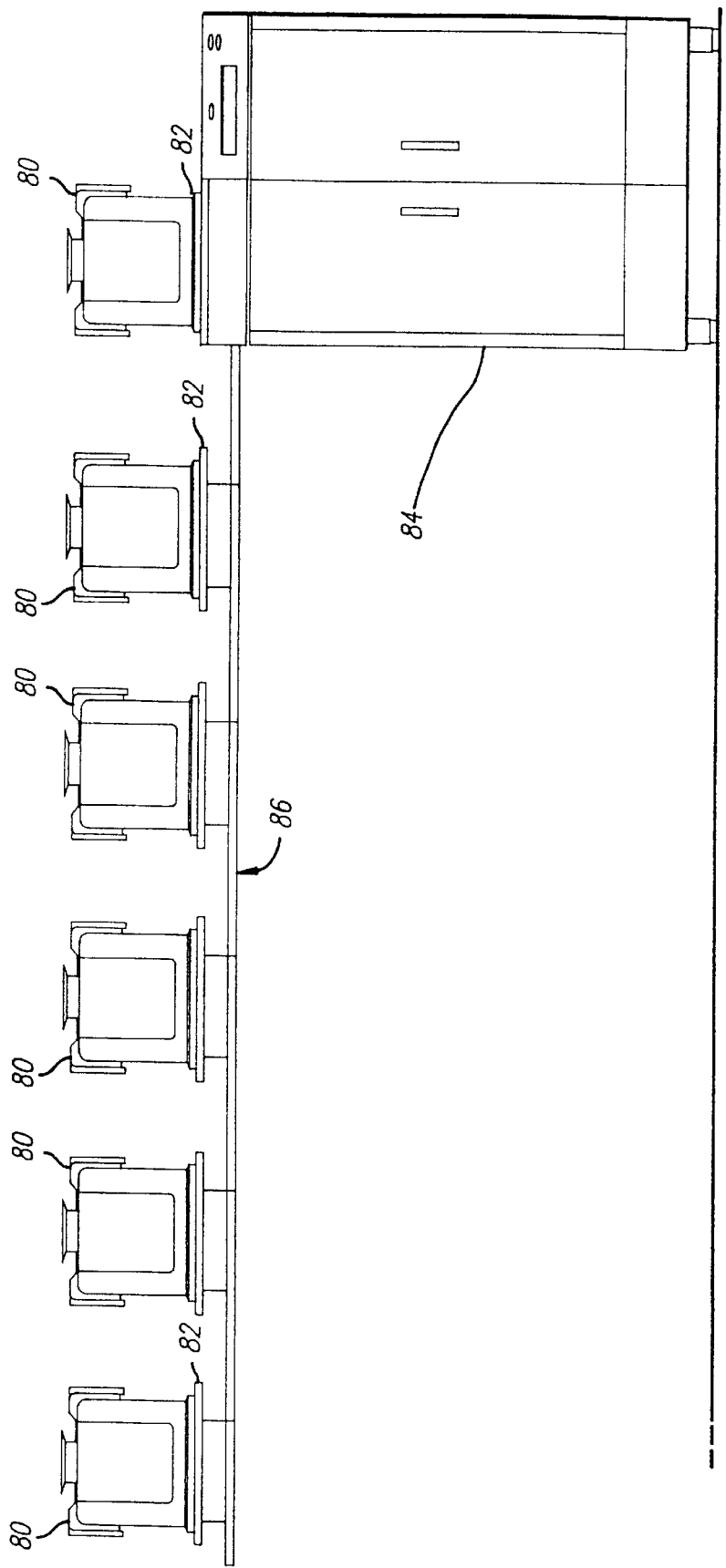
FIG. 9B is a front elevational view of an alternative embodiment of a series of several SMIF pods mounted to base plates connected in parallel to gaseous working fluid supply and exhaust lines of a molecular contamination control base unit for purging of the SMIF pods according to the invention.

As illustrated in one preferred embodiment of the system and method of the invention in FIG. 8A and in an alternative preferred embodiment in FIG. 8B, a single SMIF pod 80 can be mounted, typically manually, to a base plate 82 of a molecular contamination control module base unit 84 providing a supply of gaseous working fluid to and from the SMIF pod, as described above. In alternate preferred embodiments of the system and method of the invention illustrated in FIGS. 9A, 9B, 10 and 11, a single contamination control module base unit 84 can provide supply of gaseous working fluid to and from a plurality of SMIF pods 80. As shown in FIG. 9, a series of several SMIF pods can be mounted to base plates 82 connected in parallel to gaseous working fluid supply and exhaust lines 86, or as shown in FIG. 10, a series of several SMIF pods 80 can be mounted in a tower to base plates 82 connected in parallel to gaseous working fluid supply and exhaust lines 86.

Figure 10:
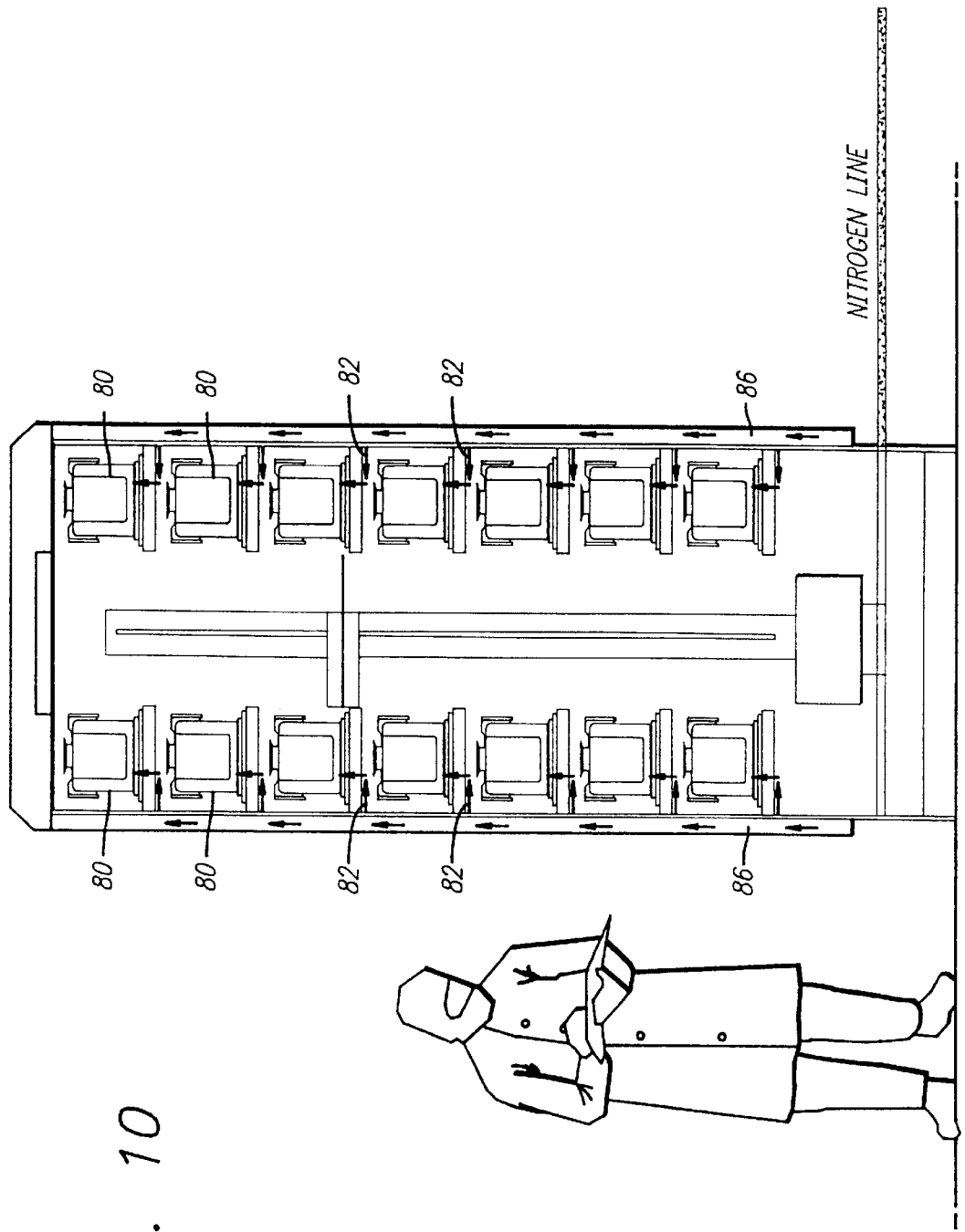
FIG. 10 is a front elevational view of several SMIF pods mounted in a tower to base plates connected in parallel to gaseous working fluid supply and exhaust lines of a molecular contamination control base unit for purging of the SMIF pods according to the invention.

As illustrated in FIG. 11, similar to the configuration of FIGS. 1A and 1B for a single SMIF pod, in the multiple pod configurations of FIGS. 9A, 9B and 10, the molecular contamination control module base unit 84 generally provides a supply 85 of the gaseous working fluid, which can typically be nitrogen or other inert gas supplied at a pressure of 80 psi, for example. The molecular contamination control base unit can also include a filter 88 for filtration of the gaseous working fluid to remove particles as small as 0.10–2.0 microns at an efficiency of about 99.999%. The molecular contamination control base unit preferably contains a purge control assembly 90 typically including a mass control valve 21 controlling the supply of gaseous working fluid to the SMIF pods. In a presently preferred embodiment, the purge control assembly also provides a desiccant chamber 20 for receiving and drying the gaseous working fluid or purge gas by exposure to a desiccant such as activated alumina, calcium chloride, silica gel, or zinc chloride, for example, that can chemically react with and remove any residual moisture in the purge gas being supplied to the SMIF pod, and that will introduce no undesirable constituents to the purge gas. Other desiccants that will introduce no undesirable constituents to the purge gas may also be suitable.

In a presently preferred embodiment, the purge control assembly also provides a heater 18 for heating the purge gas to temperatures above 100° C., but below the thermal sensitivity of the pod, i.e., 105 to 120° C. For multiple pod configurations, a manifold 92 is typically provided for distributing an even flow of gaseous working fluid to the SMIF pods. As described above in connection with FIG. 1A, in a presently preferred embodiment, the purge control unit also can also provide sensors 56 in the outlet line from the SMIF pods, with a connection to the supply line, to monitor relative humidity, oxygen and particulate content of gaseous working fluid exiting from the purged SMIF pods, and to permit testing the pre-treated gaseous working fluid for baseline constituent levels prior to introduction into a SMIF pod. Other types of sensors can also be provided for monitoring other types of contaminants such as vapor-borne halogens or radicals that can be present after conventional processes, such as chlorine, bromine, arsine, silane, for example. As in FIGS. 1A and 1B, a vacuum pump 16 is also preferably provided in fluid communication with one or more outlets of the SMIF pods for removing the gaseous working fluid or purge gas, and any particle contaminants, other types of vaporous contaminants such as from the manufacturing processes, oxygen, and humidity entrained in the gaseous working fluid or purge gas from the SMIF pod.

It will be apparent from the foregoing that while particular forms of the invention have been illustrated and described, various modifications can be made without departing from the spirit and scope of the invention. Accordingly, it is not intended that the invention be limited, except as by the appended claims.

What is claimed is:

1. Apparatus for removing a gaseous working fluid from a modular isolation capsule for purging of the modular isolation capsule, comprising:

an outlet tower adapted to be mounted to the modular isolation capsule for removing the gaseous working fluid from the modulation isolation chamber; and a check valve disposed in said outlet tower for permitting one-way flow of said gaseous working fluid from the modular isolation capsule.

2. The apparatus of claim 1, wherein said outlet tower comprises a plurality of spaced apart orifices.

3. The apparatus of claim 1, wherein said outlet tower comprises a plurality of spaced apart radial slotted ports.

* * * * *